(12) United States Patent
Sterrett et al.

(10) Patent No.: US 8,642,462 B2
(45) Date of Patent: Feb. 4, 2014

(54) INTERCONNECTION DESIGNS AND MATERIALS HAVING IMPROVED STRENGTH AND FATIGUE LIFE

(75) Inventors: Terry Lee Sterrett, Cave Creek, AZ (US); Richard J. Harries, Chandler, AZ (US)

(73) Assignee: Micorn Technology, Inc., Boise, ID (US)

( * ) Notice: Subject to any disclaimer, the term of this patent is extended or adjusted under 35 U.S.C. 154(b) by 387 days.

(21) Appl. No.: 12/100,380

(22) Filed: Apr. 9, 2008

(65) Prior Publication Data

US 2008/0254611 A1 Oct. 16, 2008

Related U.S. Application Data

(60) Division of application No. 10/472,168, filed on Apr. 30, 2003, now Pat. No. 7,387,827, and a continuation-in-part of application No. 10/321,060, filed on Dec. 17, 2002, now Pat. No. 7,521,115.

(51) Int. Cl.
*H01L 21/44* (2006.01)

(52) U.S. Cl.
USPC ............. 438/614; 257/E21.476; 257/E23.021

(58) Field of Classification Search
USPC .................... 257/772, 779, E23.015, E23.02, 257/E23.023–E23.079; 438/613–617
See application file for complete search history.

(56) References Cited

U.S. PATENT DOCUMENTS

| | | | |
|---|---|---|---|
| 5,156,771 A | 10/1992 | Yamamoto et al. | |
| 5,503,777 A | 4/1996 | Itagaki et al. | |
| 5,536,362 A * | 7/1996 | Love et al. ...................... | 216/13 |
| 5,674,780 A | 10/1997 | Lytle et al. | |
| 5,733,467 A | 3/1998 | Kawakita et al. | |
| 5,795,818 A * | 8/1998 | Marrs ........................... | 438/612 |
| 5,859,475 A | 1/1999 | Freyman et al. | |
| 6,114,413 A | 9/2000 | Kang et al. | |
| 6,153,938 A | 11/2000 | Kanda et al. | |
| 6,156,237 A | 12/2000 | Kubota et al. | |
| 6,163,463 A * | 12/2000 | Marrs ........................... | 361/773 |
| 6,212,113 B1 | 4/2001 | Maeda | |
| 6,237,218 B1 | 5/2001 | Ogawa et al. | |
| 6,300,250 B1 * | 10/2001 | Tsai .............................. | 438/694 |
| 6,315,927 B1 | 11/2001 | Kubota et al. | |
| 6,384,473 B1 | 5/2002 | Peterson et al. | |
| 6,549,484 B2 | 4/2003 | Morita et al. | |
| 6,556,486 B2 | 4/2003 | Benzinger et al. | |
| 6,586,843 B2 * | 7/2003 | Sterrett et al. ................ | 257/778 |
| 6,593,220 B1 * | 7/2003 | Yu et al. ........................ | 438/612 |
| 6,596,560 B1 | 7/2003 | Hsu | |
| 6,603,706 B1 | 8/2003 | Nystuen et al. | |

(Continued)

OTHER PUBLICATIONS

U.S. Appl. No. 10/321,060, Non Final Office Action mailed Nov. 20, 2003, 7 pgs.

(Continued)

*Primary Examiner* — David Vu
*Assistant Examiner* — Jonathan Han
(74) *Attorney, Agent, or Firm* — Schwegman, Lundberg & Woessner, P.A.

(57) ABSTRACT

Methods and designs for increasing interconnect areas for interconnect bumps are disclosed. An interconnect bump may be formed on a substrate such that the interconnect bump extends beyond a contact pad onto a substrate. An interconnect bump may be formed on a larger contact pad, the bump having a large diameter.

16 Claims, 9 Drawing Sheets

(56) References Cited

U.S. PATENT DOCUMENTS

| | | | |
|---|---|---|---|
| 6,674,686 | B2 | 1/2004 | Noh et al. |
| 6,717,832 | B2 | 4/2004 | Johnson et al. |
| 6,972,981 | B2 | 12/2005 | Ruckerbauer et al. |
| 7,046,580 | B1 | 5/2006 | Manapat et al. |
| 7,054,222 | B2 | 5/2006 | Li et al. |
| 7,113,417 | B2 | 9/2006 | Pochmuller |
| 7,221,617 | B2 | 5/2007 | Flach et al. |
| 7,227,812 | B2 | 6/2007 | Li et al. |
| 7,272,054 | B2 | 9/2007 | Waldrop |
| 7,387,827 | B2 | 6/2008 | Sterrett et al. |
| 7,521,115 | B2 | 4/2009 | Sterrett et al. |
| 7,558,151 | B1 | 7/2009 | Svoiski |
| 7,688,672 | B2 | 3/2010 | Best et al. |
| 7,995,365 | B1 | 8/2011 | D'Ambrosio et al. |
| 2002/0121692 | A1* | 9/2002 | Lee et al. ............... 257/737 |
| 2004/0115408 | A1 | 6/2004 | Sterrett et al. |
| 2006/0244139 | A1* | 11/2006 | Daubenspeck et al. ....... 257/737 |

OTHER PUBLICATIONS

U.S. Appl. No. 10/321,060, Response filed Feb. 20, 2004 to Non Final Office Action mailed Nov. 20, 2003, 7 pgs.
U.S. Appl. No. 10/321,060, Final Office Action mailed Mar. 16, 2004, 6 pgs.
U.S. Appl. No. 10/321,060, Response filed Jun. 15, 2004 to Final Office Action mailed Mar. 16, 2004, 4 pgs.
U.S. Appl. No. 10/321,060, Non Final Office Action mailed Aug. 26, 2004, 8 pgs.
U.S. Appl. No. 10/321,060, Response filed Nov. 24, 2004 to Non Final Office Action mailed Aug. 26, 2004, 8 pgs.
U.S. Appl. No. 10/321,060, Final Office Action mailed Feb. 9, 2005, 8 pgs.
U.S. Appl. No. 10/321,060, Response filed May 10, 2005 to Final Office Action mailed Feb. 9, 2005, 8 pgs.
U.S. Appl. No. 10/321,060, Non Final Office Action mailed Jul. 20, 2005, 7 pgs.
U.S. Appl. No. 10/321,060, Response filed Oct. 20, 2005 to Non Final Office Action mailed Jul. 20, 2005, 7 pgs.
U.S. Appl. No. 10/321,060, Final Office Action mailed Jan. 9, 2006, 7 pgs.
U.S. Appl. No. 10/321,060, Response filed Mar. 3, 2006 to Final Office Action mailed Jan. 9, 2006, 7 pgs.
U.S. Appl. No. 10/321,060, Advisory Action mailed Mar. 14, 2006, 3 pgs.
U.S. Appl. No. 10/321,060, Non Final Office Action mailed Jul. 3, 2006, 6 pgs.
U.S. Appl. No. 10/321,060, Response filed Oct. 3, 2006 to Non Final Office Action mailed Jul. 3, 2006, 7 pgs.
U.S. Appl. No. 10/321,060, Final Office Action mailed Dec. 14, 2006, 5 pgs.
U.S. Appl. No. 10/321,060, Response filed Nov. 7, 2007 to Final Office Action mailed Dec. 14, 2006, 7 pgs.
U.S. Appl. No. 10/321,060, Amendment filed May 28, 2008, 7 pgs.
U.S. Appl. No. 10/321,060, Non Final Office Action mailed Jun. 27, 2008, 5 pgs.
U.S. Appl. No. 10/321,060, Response filed Sep. 23, 2008 to Non Final Office Action mailed Jun. 27, 2008, 3 pgs.
U.S. Appl. No. 10/321,060, Notice of Allowance mailed Dec. 17, 2008, 4 pgs.
U.S. Appl. No. 10/427,168, Restriction Requirement mailed Mar. 13, 2006, 5 pgs.
U.S. Appl. No. 10/427,168, Response filed Apr. 13, 2006 to Restriction Requirement mailed Mar. 13, 2006, 1 pg.
U.S. Appl. No. 10/427,168, Restriction Requirement mailed Jul. 3, 2006, 5 pgs.
U.S. Appl. No. 10/427,168, Response filed Aug. 3, 2006 to Restriction Requirement mailed Jul. 3, 2006, 1 pg.
U.S. Appl. No. 10/427,168, Non Final Office Action mailed Oct. 19, 2006, 8 pgs.
U.S. Appl. No. 10/427,168, Response filed Jan. 19, 2007 to Non Final Office Action mailed Oct. 19, 2006, 6 pgs.
U.S. Appl. No. 10/427,168, Final Office Action mailed Apr. 18, 2007, 7 pgs.
U.S. Appl. No. 10/427,168, Response filed Jun. 18, 2007 to Final Office Action mailed Apr. 18, 2007, 5 pgs.
U.S. Appl. No. 10/427,168, Non Final Office Action mailed Oct. 9, 2007, 6 pgs.
U.S. Appl. No. 10/427,168, Response filed Dec. 4, 2007 to Non Final Office Action mailed Oct. 9, 2007, 2 pgs.
U.S. Appl. No. 10/427,168, Notice of Allowance mailed Feb. 12, 2008, 4 pgs.
U.S. Appl. No. 12/434,600, Non Final Office Action mailed Jan. 14, 2011, 9 pgs.
U.S. Appl. No. 12/434,600, Response filed Mar. 21, 2011 to Non Final Office Action mailed Jan. 14, 2011, 28 pgs.
U.S. Appl. No. 12/434,600, Notice of Allowance mailed Mar. 31, 2011, 5 pgs.

* cited by examiner

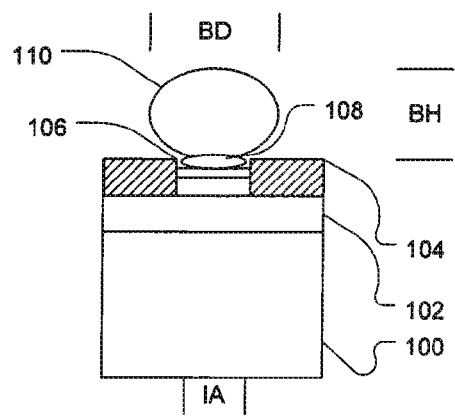
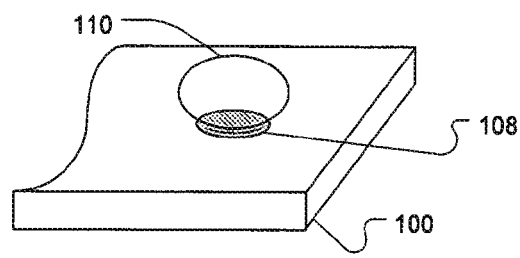
Figure 7
(Prior Art)
Figure 8
(Prior Art)
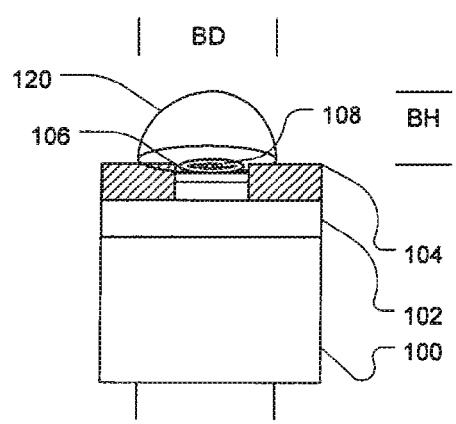
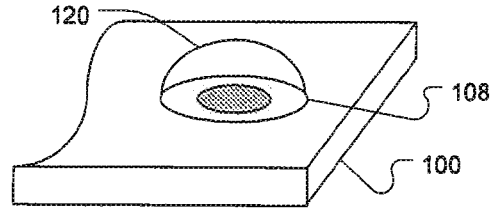
Figure 9
Figure 10

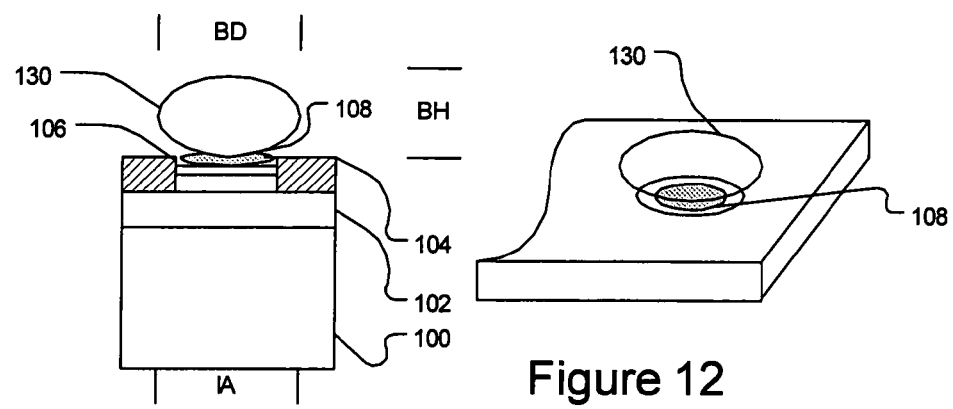
Figure 11
Figure 12
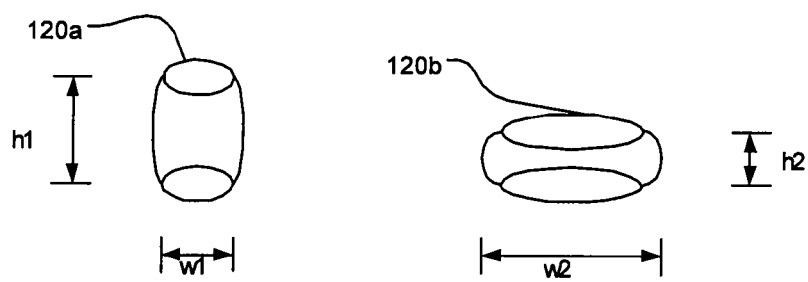
Figure 13a
Figure 13b

INTERCONNECTION DESIGNS AND MATERIALS HAVING IMPROVED STRENGTH AND FATIGUE LIFE

CROSS REFERENCE TO RELATED APPLICATIONS

This application is a Divisional of U.S. patent application Ser. No. 10/427,168, entitled INTERCONNECTION DESIGNS AND MATERIALS HAVING IMPROVED STRENGTH AND FATUGUE LIFE, filed 30 Apr. 2003, which is a continuation-in-part of U.S. patent application Ser. No. 10/321,060, entitled LOW TEMPERATURE BUMPING PROCESS, filed 17 Dec. 2002, the disclosure of which is herein incorporated by reference in its entirety.

BACKGROUND

The thermal conditions to which most electronic devices are subjected may adversely affect those components made out of alternative materials. For example, polymeric ferroelectric random access memory (PFRAM) devices exposed to temperatures of approximately 140 degrees Celsius (° C.) have significantly decreased performance. For example, a process that exposed a PFRAM to 100° C. for 2 hours followed by a ramp up to 125° C. for 7 minutes caused a thirty percent reduction of cells in the device that retained their contents.

Typically, packaging of electronic components such as microprocessors and other integrated circuits involves high temperatures, especially at the formation of the first level of interconnection. The first level of interconnection is where the integrated circuit is mounted onto the printed circuit board (PCB) so as to allow the integrated circuit to be electrically coupled to the PCB. Some examples of current approaches to the first level of interconnects include wire bonding, which has a typical temperature range of about 140° C. to >200° C., and anisotropic conductive films, which have a typical temperature of 180° C.

Thermo-mechanical stressing, caused in part by these high temperatures, may cause first and second level interconnects to fail. The high temperatures may also lead to inter-laminar dielectric, also referred to as inter-layer dielectric (ILD) cracking.

BRIEF DESCRIPTION OF THE DRAWINGS

Embodiments of the invention may be best understood by reading the disclosure with reference to the drawings, wherein:

FIG. 7 is a side view, shown partly in section, of a prior art embodiment of an interconnect bump.

FIG. 8 is a perspective view of the embodiment of FIG. 7.

FIG. 9 is a side view, shown partly in section, of an embodiment of an interconnect bump.

FIG. 10 is a perspective view of the embodiment of FIG. 9.

FIG. 11 is a side view, shown partly in section, of an embodiment of a bump connection.

FIG. 12 shows a perspective view of the embodiment of FIG. 11.

FIGS. 13a and 13b show alternative embodiments of a interconnect bump.

DETAILED DESCRIPTION OF THE EMBODIMENTS

Figure 1:
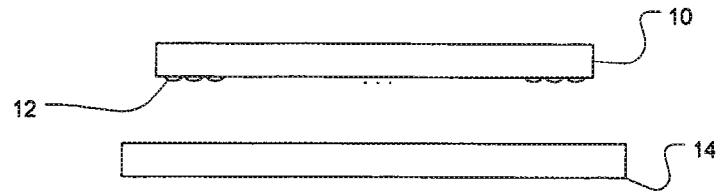
FIG. 1 shows a flip chip integrated circuit arrangement relative to a printed circuit board.

The use of polymeric materials as the first level of interconnect between a flip chip and a printed circuit board would allow processing of the chip at a lower temperature. This would have advantages for integrated circuits, such as polymer ferroelectric random access memories (PFRAM) among others, that suffer performance degradation at the higher temperature normally used. 'Flip chips' are those integrated circuits that are mounted on the printed circuit board operational side down. The first level of interconnection is where the integrated circuit is mounted onto the printed circuit board (PCB) so as to allow the integrated circuit to be electrically coupled to the PCB, typically through conductive bumps patterned onto the integrated circuit die. FIG. 1 shows a block diagram of an integrated circuit die 10 with it associated interconnect bumps 12 just before being mounted to a printed circuit board 14.

Polymeric interconnect bumps manufactured from resin systems could be processed at temperatures from room temperature, approximately 23° C., to 150° C., with the majority of the processing temperatures between 100° C. and 150° C. Polymeric bumps may be stencil printed at pitches from 150 µm to 500 µm. The bump heights may range from about 35 µm to 100 µm. However, selection of the materials used in these bumps must be made carefully, as hydrolytic stability issues may cause conductive filler particles to separate.

Figure 2:
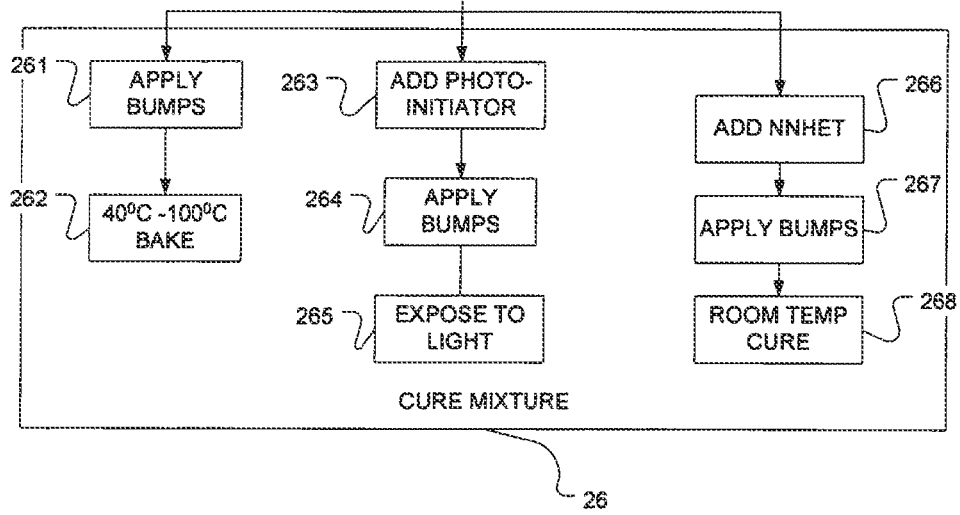
FIG. 2 shows flowchart of a method to produce interconnect bumps.

A flowchart of an embodiment of a method to manufacture polymeric interconnect bumps is shown in FIG. 2. A resin is selected that may be capable of being cross-linked by free-radical polymerization at 20. Suitable resins include olefin materials having double bond structures, such as materials in the following classes: acrylates, methacrylates, epoxies having olefinic groups, and polyimides having olefinic groups. Resins have the structure as shown in FIG. 3 are suitable.

Figure 3:
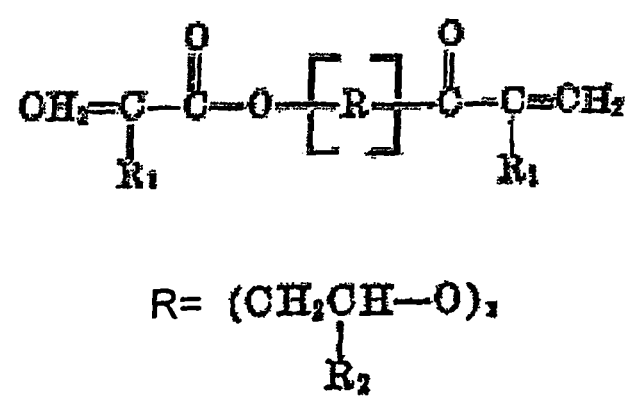
FIG. 3 shows a diagram of a molecular structure for a resin.

In FIG. 3, R1 may be a hydrogen (H) or alkyl of 1 to 4 carbons (C), R is as shown, R2 is a hydrogen or an alkyl group of 1 to 4 carbons, and x can be an integer between 1 to 5. Examples of such resins include, but are not limited to, bisglycidyl methacrylate (Bis-GMA), ethoxylated bisphenol A (EBPA), etc. As an optional part of the process in FIG. 2, the resin provided in 20 may be blended with reactive diluents at 24 to control viscosity. An example of such diluents includes, but is not limited to, triethylene glycoldimethacrylate (TGMA), etc.

At 22, electrically conductive particles are added. Examples of materials having the electrically conductive properties include, but are not limited to, silver, tin, indium, bismuth, palladium, platinum, nickel, copper and zinc. The particles may be added in spherical or irregularly shaped form, having high hardness and particle size in the range of about 0.1 µm to 100 µm. Concentration of electrically conductive particles may be in the range of about 50 to 200% by weight, particle to resin, and electrically conductive paste (ECP) viscosity may be in the range 1000 to 100000 cPS at room temperature allowing for patterning and formation of a face-centered bump structure via stencil printing or other similar means. ECP viscosity can be adjusted as needed in accordance with processing temperature, noting that applications requiring elevated processing temperatures will be formulated to have relatively high room temperature viscosity because it will tend to decease as temperature is elevated.

A suitable formulation could be a resin blend of 10% bis-GMA, 25% TGMA, 30% EBPA; the mixture having a 35 to 50% resin blend, 0.5 to 1.5% benzoyl peroxide (BPO), 0.01 to 0.05% butylated hydroxoytoluene (BHT), and 65 to 50% conductive filler particle. The mixture would then be polymerized at 26 after being applied to the integrated circuit die. Several different options for polymerization may be available.

Polymerization of the mixture can be initiated by introducing the mixture to 40° C. to 100° C. In this embodiment, the bumps would be applied to the die at 261 and then baked at 262. In order to speed up the reaction 0.01 to 1% N,N-Bis(2-hydroxyethyl)-p-toluidine (NNHET) can be added as an activator at 266. Incorporation of NNHET will allow for cure in the temperature of room temperature (~23° C.) and greater at 268. However, using a material that cures are room temperature will require that the bumps being applied at 267 almost immediately after NNHET is added at 266. Application of the mixture to the die could be done in several ways, such as stencil printing the bumps prior to the curing.

In an alternative embodiment using the electrically conductive polymeric paste material of the resin system and formulation disclosed above, BPO and NNHET are replaced by photo-initiator systems at 263. Suitable photo-initiators include benzyl, camphorquinone, fluorenone, α-napththil. Such photo-initiated systems can be formulated so as to use UV and/or visible light. The mixture would then be exposed to light at 265, after being applied to the integrated circuit die at 264, such as by stencil printing.

Figure 4:
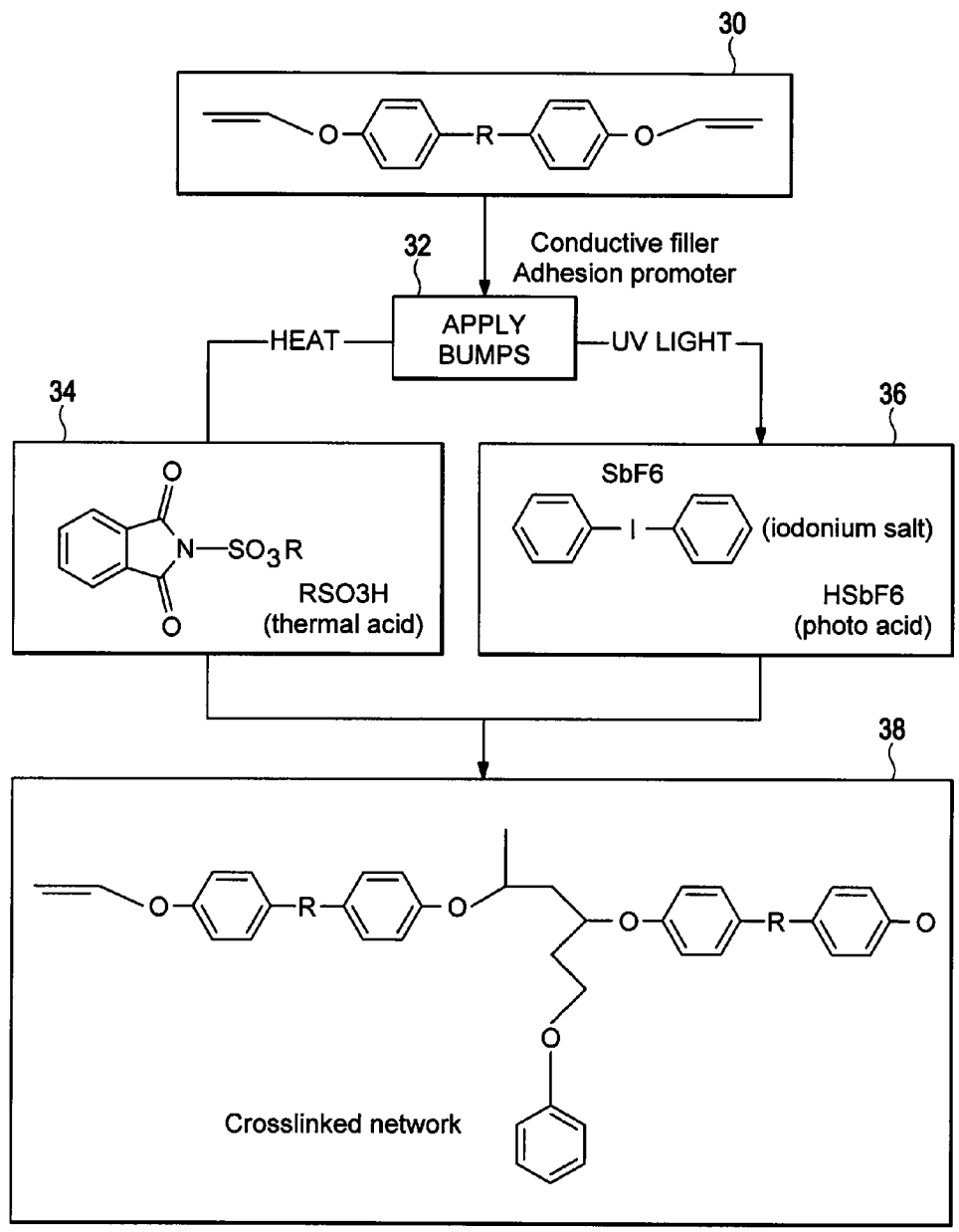
FIG. 4 shows an embodiment of a chemical process to form interconnect bumps.

An alternative embodiment of a photopolymerizable system employing cationic polymerization is shown in FIG. 4. Vinyl ether based resins are well known to be cross linked via cations. A vinyl ether system may be as shown in 30, with R having the same definition as set out in FIG. 3. Cations can be generated via thermally degradation of appropriate precursors, or via generation of the same using photo initiated process. Suitable examples of thermally activated acid generators include, but are not limited to, hydroxamic acids esters, diazosulfonates, etc. These degrade at temperatures around but less than 100° C., resulting in acids that catalyze the cross linking of the resin system.

At 30, the vinyl ether resin would be combined with the thermally activated acid generators, the bumps applied at 32 and then the bumps heated at 34. Examples of thermally activated acid generators include hydroxamic acid esters and diazosulfonates. This would result in the structure as shown in 38. A conductive filler adhesion promoter could be added as an optional part of the process prior to applying the bumps.

Proceeding from 30 to 36, light would be used to promote the polymerization. Photo-initiators would be added at 30, the bumps applied at 32 and then exposed to light at 36. Examples of some photo-initiators include iodonium and sulfonium salts, o-nitrobenzyl esters etc. Photo-initiated systems can be formulated so as to use UV and/or visible light.

Figure 5:
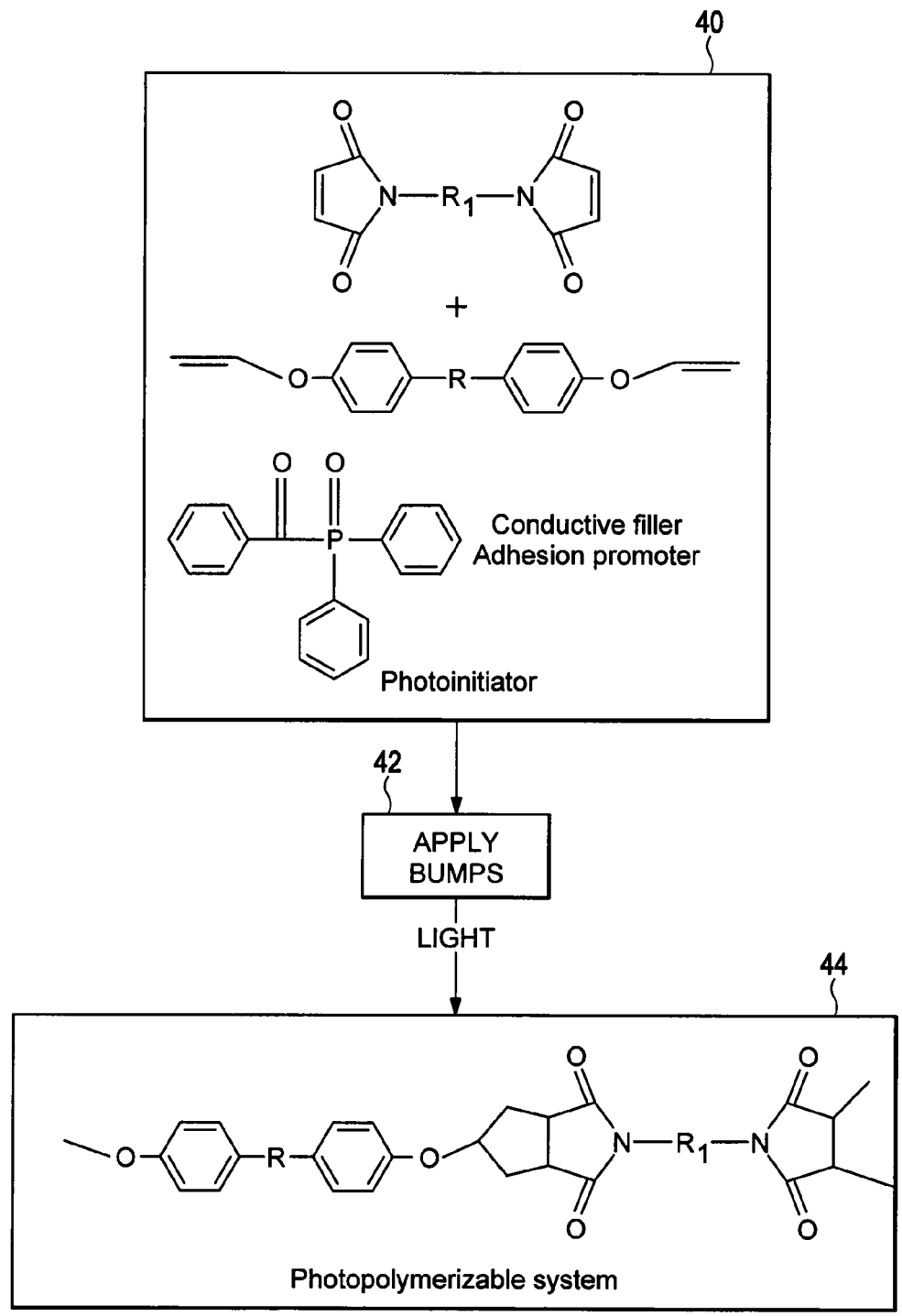
FIG. 5 shows an alternative embodiment of a chemical process to form interconnect bumps.

Other alternatives to acrylates/methacrylate systems that could be crosslinked via free radical mechanism are electron donor/acceptor based systems. One example of such a system may be a maleimides/vinyl ether based system. Here maleimides are the electron acceptors, while the vinyl ethers form the donors. Thus in the presence of photo-initiated radicals, the maleimides react with vinyl ethers thus starting the polymerization, resulting in cross linked network. This can be seen in FIG. 5. The top molecule would be the maleimide molecule that may be then added to the vinyl ether, the middle molecule at 40. The photo-initiator may be then added. Once the bulk mixture is completed, the bumps are applied at 42. The mixture exposed to light after application on the die and this results in the bumps having the structure shown at 44.

A simple formulation would entail, mixing 1:1 maleimide/vinyl ether resin system, to which 1-3 wt % of a photo-initiator, such as BPO, or keto phosphine oxide systems are added. To this conductive filler ranging anywhere from 50 to 90 wt % may be added. The mixture may be stencil printed and exposed to UV light. In the exposed areas, radicals are generated and the material starts to crosslink, thus forming the polymer bumps.

Figure 6:
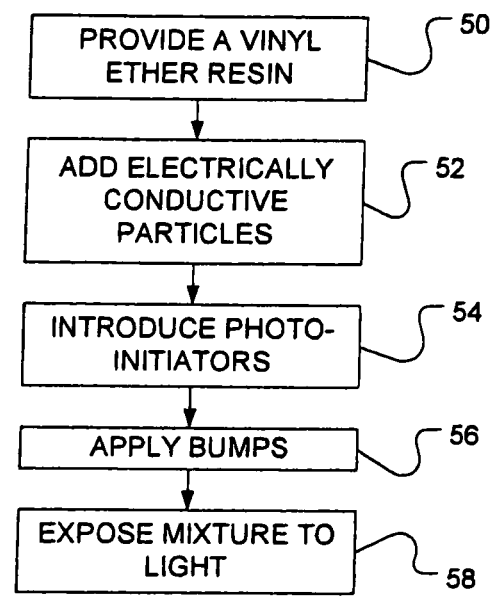
FIG. 6 shows a flowchart of an alternative method to produce interconnect bumps.

In this manner, polymer bumps are formed on an integrated circuit die. A flowchart for an embodiment of a method to manufacture polymer bumps by photo polymerization is shown in FIG. 6. At 50, a vinyl ether resin may be provided. This may be for the cation cross linking process shown in FIG. 4 or the maleimides system shown in FIG. 5. For the cation cross linking process, thermally activated acid inducers or photo-initiators may be added. For the maleimides system of FIG. 5, both a maleimide and a photo-initiator would be added as part of the process 50.

At 52 the electrically conductive particles are added to the resin mixture. Photo-initiators are then added at 54. The mixture would be applied to the die at 56, such as by stencil printing, and exposed to light at 58. This provides electrically conductive polymer bumps on the die that can be processed at temperatures lower than conventional bumping processes, preventing injury to integrated circuits manufactured out of temperature sensitive materials.

Generally, the embodiments of the invention may result in interconnections having lower residual stress. This is because stress, $\sigma = \Delta\alpha \cdot \Delta T \cdot E$; where $\Delta\alpha$=difference in coefficient of thermal expansion (CTE), $\Delta T$=difference in temperature, E=modulus. In embodiments of the above processes, the polymeric materials resulting have modulus in the range of about 10 to 50 times smaller that metallic counter parts and $\Delta T$ has been substantially decreased. The maximum temperature for curing the material will typically be in a range of about 40° C. to 150° C. The range of stress values for this temperature range is about 0.0034 giga Pascals (GPa, $1 \times 10^9$ Pascals) to 0.02813 GPa, It may be possible that these processes could be adapted to utilize benzocyclobutene (BCB), which has some unique properties that may provide mechanical advantages for flip chip structures. The process may result in electrically conductive BCB. The use of BCB in such a system would form low modulus and therefore high compliance no-lead bumps that provide improved stress distribution and bump fatigue. BCB has a glass transition temperature greater that the expected service temperature thus allowing for essentially linear mechanical behavior through out the device's anticipated service environment. The BCB could be used in any of the embodiments disclosed above and in other variations and modifications of embodiments of the invention.

It is also possible to change the geometries of the interconnect bumps to increase the strength and lengthen the fatigue life of the interconnects. The fatigue life is the amount of time during which an interconnect remains uncracked or undamaged from fatigue. The first and second level interconnections in current implementations suffer from premature failure due to thermo-mechanical stressing. The first level interconnect is between the integrated circuit and its package and the second level interconnect is between the package and a system board, such as a printed circuit board or other surface to which the package is mounted.

The interconnects, also called interconnect bumps, may suffer from bump-induced inter-laminate dielectric, or inter-layer dielectric (ILD) cracking and poor second level solder joint reliability. This is especially true for low-K materials. A low-K material is one in which the constant, K, the dielectric constant of the material is less than 10. Bump-induced ILD cracking has been found to be driven by thermally induced loads during assembly, where large temperature changes tend to exacerbate the phenomena. Generally, stress in a material can be characterized by the relation:

$$\sigma = E \Delta T \Delta \alpha;$$

discussed above.

Current approaches have attempted to decrease the stress on interconnects by decreasing the modulus, minimizing assembly temperature deltas or minimizing the coefficient of thermal expansion deltas for the materials. These are typically accomplished by judiciously selecting materials and designing the interconnects where the transference of stress from the bump to ILD layer is buffered by surrounding structures. Some materials that have been evaluated include indium, tin-indium-silver alloys, and other low melting point alloys. However, while these materials have good superplastic properties to handle the stress without cracking, they generally oxidize very quickly, making it difficult to form bumps out of the alloys. Similarly, they have low melting points and may actually remelt during processing, preventing bump formation.

It is possible, by increasing the area of an interconnect, to reduce the stress associated with a particular force. The relationship is $\sigma = F/A$, where $\sigma$ is stress, F is force, and A is cross-sectional area. Therefore, by increasing the contact area of the interconnection, it is possible to reduce the stress associated with a particular force. It must be noted here that interconnection, as used here, refers to the mechanical interconnection between materials and structures, not electrical interconnection, even though it is the purpose of interconnect bumps to provide electrical interconnection.

An embodiment of a prior art interconnect is shown in FIG. 7. The substrate 100 has upon it an active layer 102, in which may be formed electronic structures such as transistors, and a passivation layer 104, which forms a protective and insulating layer over the active layer. An opening 106 is formed in the passivation layer 104. A contact pad 108, typically metalized, provides a means for the interconnect bump 110 to make electrical connection to the active layer 102.

The interconnect bump 110 may be described by several different dimensions. The bump diameter is shown on FIG. 7 as the dimension BD, BH on FIG. 7 represents the bump height, and IA represents the interconnection area. In typically current implementations, the bump height is approximately equal to the bump diameter as most current implementations are spherical, often referred to as solder balls. The interconnect area is generally 40 to 70 micrometers (μm) squared.

As can be seen by FIG. 8, a perspective drawing of the prior art interconnect, the bump connection in the prior art is dictated by the area of the metal contact pad 108. The bump connection is area where the interconnect bump contacts the contact pad. In one embodiment of the invention, the interconnect bump is manufactured from an electrically conductive polymer, possibly via stencil printing. The bump extends beyond the surface of the contact pad to also contact the passivation layer. This can be seen in FIG. 9.

In FIG. 9, the passivation opening 106 is the same size as in the prior art. However, the interconnect bump 120 extends beyond the limits of the contact pad 108 to contact the passivation layer 104. In one embodiment the bump height, BH, is approximately ⅓ the bump diameter, BD. The interconnect area, IA, has been evaluated to range approximately from 130 to 240 μm.

Electrically conductive polymers may be used in conditions where metals may not. While they are electrically conductive, they do not have any parasitic inductance or current leakage problems associated with metals. These materials can be used at either the first or second level interconnects. For first level interconnects, the substrate onto which the bumps extend would be the substrate of the integrated circuit die or package. For second level interconnects the substrate may be the surface of a system board.

One possible electrically conductive polymer may be a silver-filled epoxy, such as those discussed above, or benzo-cyclobutene (BCB). The stress distributing benefits are further improved by these materials due to their high compliancy. High compliancy, as used here, means that the modulus of the materials is in the range of approximately 0.5 to 6 GigaPascals (GPa). Most conventional solder materials have a modulus in the range of approximately 10 to 20 GPa.

If the same volume of material were used to form such an interconnect as was used to form the previous interconnect of FIG. 8, it would encompass about two-thirds the height of the interconnect. This leads to increased stability and an increase in the shearing force the interconnect can withstand. In addition, the higher interconnection area for a given force reduces the stress according the formula previously discussed. The embodiment of the interconnect bump of FIG. 9 is shown in perspective view in FIG. 10.

Another possible means to increase the interconnection area is to increase the size of the interconnect by increasing the size of the contact pad and using a metal alloy interconnect. This can be done by increasing the size of the passivation opening. This particular aspect of embodiments of the invention may be critical for applications employing metal alloy interconnects because such material generally cannot extend onto substrate surfaces. With this in mind, it is therefore necessary to optimize the relationship between interconnect height and contact area for given interconnect volumes.

Turning to FIG. 11, a larger interconnect bump 130 is formed by creating a wider passivation hole 106 in the passivation layer 104. The contact pad 108 can then be made larger and the overall interconnection area increased. For purposes of this discussion, a large-diameter bump is defined to be one having an interconnect height to area ratio of at least 1.25, as will be discussed in more detail with reference to FIG. 15, for given solder volume. The vertical extent of this interconnect bump can either have the same volume and be relatively shorter in bump height, or have an increase in volume to have a height similar to that of the previous interconnect shown in FIG. 8. This can be seen in FIGS. 12, 13a and 13b.

In a modeling study of interconnect bump diameter on a low density interconnect (LDI) package, a comparison was made between fatigue life and passivation hole size. For purposes of this example, an LDI is one with less than 300 input/output connections. In the below example, the Darveaux statistical modeling for solder joint reliability fatigue life under thermocyclic conditions was used.

| Interconnect Bump Diameter (µm) | Passivation Opening (µm) | Standoff Height (mm) | Final Bump Diameter (mm) | Characteristic Life (# cycles) |
|---|---|---|---|---|
| 300 | 250/350 | 0.19223 | 0.31536 | 738 (package side) |
|  |  |  |  | 1710 (board side) |
| 300 | 300/400 | 0.15331 | 0.3369 | 865 (package side) |
|  |  |  |  | 2054 (board side) |

The results show that by increasing the passivation opening 50 µm the fatigue life increased by nearly 20%. For this particular study, the bump volume was held constant, so the standoff height decreased with increasing passivation hole size. In this particular example, passivation hole size offsets the negative effect of a shorter standoff height. However, performing this study with an increased bump volume would follow the same trend.

As can be seen in FIGS. 13a and 13b, two different embodiments of interconnect bumps are shown. In FIG. 13a, the interconnect bump 120a is relatively 'tall.' This reduces the surface area of the connection between the bottom of the interconnect bump and any underlying substrate. Reducing the surface area of the connection between the bump and the underlying substrate reduces the shearing strain the bump can withstand.

Shearing strain is the strain caused by trying to 'push over' the bump by applying a force to the side of the bump. The formula for shear strain is U/H, where U is the movement of the plate, in this case the bump, divided by the height (H). For a given U, then, a bump with more height has a lower shear strain, meaning that the bump can withstand less shearing force.

In contrast, the bump 120b of FIG. 13b, having a height h2, has a much higher surface area of the connection between the bump and any underlying substrate. This increases the shear strain the bump can withstand. In addition, it promotes solder joint reliability, as there is more material for a crack to have to penetrate to cause the solder joint to crack. The surface area of the connection in FIG. 13b has a width, w2, which is twice as wide as the width of the connection of FIG. 13a, w1. Larger surface area of a solder joint makes that joint harder to crack.

Figure 14:
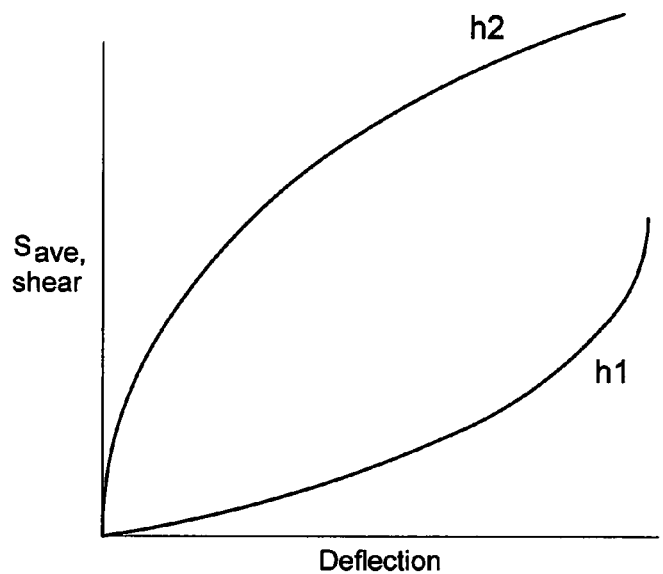
FIG. 14 shows a graph of interconnect bump height versus average shear.
Figure 15:
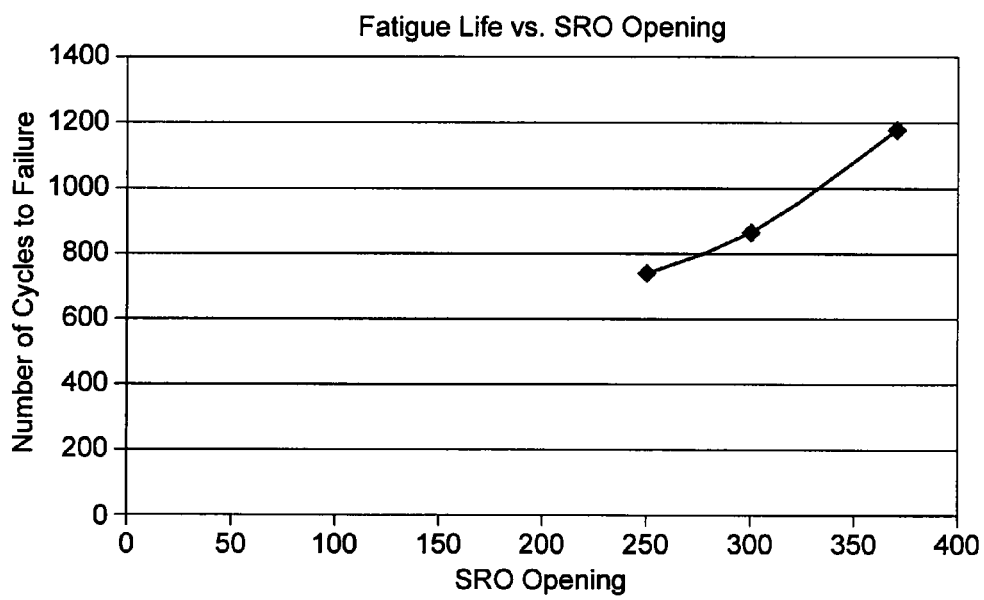
FIG. 15 shows a graph of solder resist opening sizes versus average shear.

Referring now to FIGS. 14 and 15 experimental results for larger-diameter balls are shown. FIG. 14 shows a graph of the deflection versus the average shear for the two different heights shown in FIGS. 13a and 13b. The shorter height, h2, has a higher average shear resistance. Deflection is the deformation seen at the bump due to application of the shearing force.

In FIG. 15, a plot is provided of a comparison of the fatigue life in number of cycles against the solder resist opening (SRO) in the passivation layer through which the interconnect is connected to the underlying contact pad. As can be seen, the larger opening connections have a longer fatigue life. Also from FIG. 15, it is possible to determine that large-diameter balls can be defined as those having a height to area ratio of 1.25. For purposes of discussion here, then, a large diameter ball is defined as one having a height to area ratio of 1.25 for a given solder volume. A possible material for these large-diameter bumps may be a tin-silver-copper alloy stencil printed in the same fashion as those of the electrically conductive polymer. For example, an alloy of 95.5% tin, 3.8% silver and 0.7% copper, listed in the below table as Sn—Ag—Cu, may be used. A comparison of the bump shear strength for both this alloy as well as silver-filled epoxy bumps having different interconnection areas.

| Bump | Bump Height (µm) | Interconnect Dimension (µm) | Interconnect Area (µm)² | Ave. Shear Load (gf) | Ave. Shear Stress gf/(µm)² |
|---|---|---|---|---|---|
| Sn—Ag—Cu | 95-100 | 40.85 square | 1669 | 23.3. | 0.0139605 |
| Sn—Ag—Cu | 95-100 | 80 octagon | 5027 | 52.2 | 0.0103839 |
| Ag-filled polymer | 30-35 | 40.85 square 140 base | 15394 | 49.6 | 0.003222 |
| Ag-filled polymer | 30-35 | 80 octagon 130 base | 13273 | 41.8 | 0.0031493 |
| Ag-filled polymer | 95-100 | 80 octagon 240 base | 45239 | 100.5 | 0.0022215 |

The interconnect dimension property includes the shape and the diameter of the base due to the passivation hole size. For example, the silver-filled polymer has a bump height of 95-100 µm, a shape of an octagon of 80 µm and a passivation hole base diameter of 240 µm.

Figure 16:
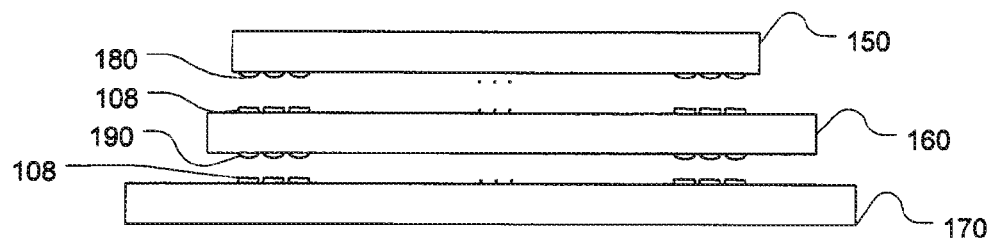
FIG. 16 shows a side view of an embodiment of first and second level interconnect bumps in an integrated circuit die, package and system board configuration.

Having discussed alternative embodiments of increasing the size of the interconnection area to reduce the stress, it is now possible to discuss the uses of such interconnects. In FIG. 16, a configuration of an integrated circuit die 150 to be mounted onto a package 160 and ultimately on a system board 170. The system board 170 may be a printed circuit board upon which are laid down electrically conductive traces. The traces have contact pads 108 at the appropriate spots to allow the signals from the die 150 to travel through the first level interconnects 180 through the pads 108 on the package 160 and then out of the package 160 through the second level interconnects 190 to the system board. The signals are then available to other devices attached to the system board, as well as to other devices on other system boards in communication with system board 170. Either or both of interconnects 180 and 190 can be implemented using the interconnects of FIGS. 9-12, with either or both the package and the board acting as the substrate.

In addition to the higher compliancy, and larger interconnection area, the materials discussed in these embodiments, as well as variations thereof, may allow the further processing of the interconnects to be performed at lower-than-normal temperatures. Typical processing temperatures range from approximately 180° C. to 240° C. In using embodiments of this invention, further processing temperatures may range only from approximately 25° C. to 160° C. This also lowers the temperature deltas (ΔT), which also contributes to the lower stress on the joints. These factors contribute to improved interconnection strength and durability, decreased interconnection induce ILD cracking, improved second level solder joint reliability and a means for providing low assembly temperature interconnections.

Thus, although there has been described to this point a particular embodiment for a method and apparatus for interconnects and materials with increased strength and fatigue life, it is not intended that such specific references be considered as limitations upon the scope of this invention except in-so-far as set forth in the following claims.

What is claimed is:

1. A method comprising:
forming a passivation layer above a substrate;
forming an opening in the passivation layer;
forming a contact pad in the opening; and
forming an interconnect bump above the contact pad such that the interconnect bump remains extending directly on a top surface of the passivation layer to provide an interconnection area wider than a top surface of the contact pad, such that the interconnect bump contacts the top surfaces of the passivation layer and the contact pad at substantially the same height, and such that the interconnect bump has a diameter greater than a size of the opening after the interconnect bump is cured.

2. The method of claim 1, wherein providing the contact pad in the opening comprises providing the contact pad of an integrated circuit.

3. The method of claim 1, wherein providing the contact pad in the opening comprises providing the contact pad of a system board.

4. The method of claim 1, wherein forming the interconnect bump comprises forming the interconnect bump from a material having a modulus in the approximate range of 0.5 to 6 GigaPascals.

5. The method of claim 1, the method further comprising performing further processing on a structure formed by the interconnect bump and contact pad at temperatures having an approximate range of 25° C. to 160° C.

6. The method of claim 1, wherein forming the interconnect bump comprises forming the interconnect bump from a silver-filled epoxy.

7. The method of claim 1, wherein forming the interconnect bump comprises forming the interconnect bump from benzocyclobutene.

8. The method of claim 1, wherein forming the interconnect bump comprises forming the interconnect bump to have a height approximately ⅓ of the diameter of the interconnect bump.

9. A method comprising:
forming an active layer above a substrate;
forming a passivation layer directly on the active layer;
forming an opening in the passivation layer;
forming a contact pad in the opening, the contact pad electrically coupled with the active layer; and
forming an interconnect bump directly on the contact pad such that the interconnect bump remains extending directly on a top surface of the passivation layer to provide an interconnection area wider than a top surface of the contact pad, such that the interconnect bump contacts the top surfaces of the passivation layer and the contact pad at substantially the same height, and such that the interconnect bump has a diameter greater than a size of the opening after the interconnect bump is cured.

10. The method of claim 9, wherein providing the contact pad in the opening comprises providing the contact pad of an integrated circuit.

11. The method of claim 9, wherein providing the contact pad in the opening comprises providing the contact pad of a system board.

12. The method of claim 9, wherein forming the interconnect bump comprises forming the interconnect bump from a material having a modulus in the approximate range of 0.5 to 6 GigaPascals.

13. The method of claim 9, the method further comprising performing further processing on a structure formed by the interconnect bump and contact pad at temperatures having an approximate range of 25° C. to 160° C.

14. The method of claim 9, wherein forming the interconnect bump comprises forming the interconnect bump from a silver-filled epoxy.

15. The method of claim 9, wherein forming the interconnect bump comprises forming the interconnect bump from benzocyclobutene.

16. The method of claim 9, wherein forming the interconnect bump comprises forming the interconnect bump to have a height approximately ⅓ of the diameter of the interconnect bump.

* * * * *

UNITED STATES PATENT AND TRADEMARK OFFICE
CERTIFICATE OF CORRECTION

PATENT NO. : 8,642,462 B2  
APPLICATION NO. : 12/100380  
DATED : February 4, 2014  
INVENTOR(S) : Sterrett et al.

Page 1 of 1

It is certified that error appears in the above-identified patent and that said Letters Patent is hereby corrected as shown below:

On the title page, in column 1, under "Assignee item (73)", line 1, delete "Micorn" and insert --Micron--, therefor Signed and Sealed this  
Twenty-seventh Day of May, 2014

Michelle K. Lee  
*Deputy Director of the United States Patent and Trademark Office*